United States Patent
Sunohara et al.

(10) Patent No.: US 8,183,469 B2
(45) Date of Patent: May 22, 2012

(54) WIRING BOARD AND METHOD OF MANUFACTURING THE SAME

(75) Inventors: Masahiro Sunohara, Nagano (JP); Kei Murayama, Nagano (JP); Takaharu Yamano, Nagano (JP)

(73) Assignee: Shinko Electric Industries Co., Ltd., Nagano-shi (JP)

(*) Notice: Subject to any disclaimer, the term of this patent is extended or adjusted under 35 U.S.C. 154(b) by 606 days.

(21) Appl. No.: 12/348,514

(22) Filed: Jan. 5, 2009

(65) Prior Publication Data

US 2009/0183911 A1    Jul. 23, 2009

(30) Foreign Application Priority Data

Jan. 21, 2008  (JP) .................................. 2008-010489

(51) Int. Cl.
*H05K 1/11* (2006.01)
(52) U.S. Cl. ..................................................... 174/267
(58) Field of Classification Search .................. 174/266, 174/267
See application file for complete search history.

(56) References Cited

U.S. PATENT DOCUMENTS 6,188,028 B1 * 2/2001 Haba et al. .................... 174/266
6,518,518 B1 * 2/2003 Saiki et al. .................... 174/267

FOREIGN PATENT DOCUMENTS

| JP | 1-226160 | 9/1989 |
| JP | 10-163267 | 6/1998 |
| JP | 2000-183507 | 6/2000 |

* cited by examiner

*Primary Examiner* — Chau Nguyen
(74) *Attorney, Agent, or Firm* — Kratz, Quintos & Hanson, LLP

(57) ABSTRACT

A wiring board includes an external connection terminal of a cylindrical shape, in which an electrode terminal of the electronic component to be mounted is fitted. In one configuration, a portion of the external connection terminal is electrically connected to a pad portion formed on an electronic component mounting surface side of the wiring board, and the external connection terminal is curvedly formed in such a shape that the outer periphery of the electrode terminal comes into close contact with the inner periphery of the middle portion of the external connection terminal when the electrode terminal is inserted into the external connection terminal.

7 Claims, 9 Drawing Sheets

CASE WHERE NO STRESS OCCURS

CASE WHERE STRESS OCCURS IN UP/DOWN DIRECTION

CASE WHERE STRESS OCCURS IN LATERAL DIRECTION

UNDER TEMPERATURE CYCLIC TEST

UNDERFILL RESIN FILLING (THERMOSETTING)

WIRING BOARD AND METHOD OF MANUFACTURING THE SAME

CROSS-REFERENCE TO RELATED APPLICATIONS

This application is based on and claims priority of Japanese Patent Application No. 2008-010489 filed on Jan. 21, 2008, the entire contents of which are incorporated herein by reference.

BACKGROUND OF THE INVENTION (a) Field of the Invention

The present invention relates to a technique of mounting an electronic component such as a semiconductor device on a wiring board, and more particularly to a wiring board (hereinafter also referred to as "package" for the sake of convenience) adapted to detachably mount an electronic component thereon, and to a method of manufacturing the same.

(b) Description of the Related Art

For surface mounting of an electronic component (a chip) such as a semiconductor device on a wiring board (a package), wire bonding, flip chip bonding or the like is used as means for providing an electrical connection between the chip and the package. The wire bonding requires a bonding area (an area having an arrangement of pads for wire connections) around the chip mounted on the package, resulting in the package with a correspondingly large area, while the flip chip bonding is effective in a reduction in size of the package, since this bonding permits mounting of the chip on the package with a conductive bump sandwiched therebetween and thus eliminates the need for the bonding area around the chip.

In an electronic component device of such a flip chip bonding type, the electrical connection between the chip and the package is accomplished by using: one method (namely, bonding using the same metal) that involves providing bumps made of the same metallic material on both the chip and the package, or alternatively providing a metal bump only on the chip, and bonding the chip and the package together with the bumps made of the same metal sandwiched therebetween; or another method (namely, bonding using different metals) that involves providing bumps made of different metallic materials on the chip and the package, respectively, and bonding the chip and the package together with the bumps made of different metals. For example, the bonding using the same metal includes bonding of a solder bump to a solder bump, while the bonding using different types of metals include bonding of a copper (Cu) bump to a solder bump, bonding of a gold (Au) bump to a solder bump, and the like.

An example of techniques related to the above-mentioned conventional techniques is disclosed in Japanese unexamined Patent Publication (JPP) (Kokai) 2000-183507. The technique disclosed in this publication involves vertically arranging conductive columnar elements on electrode pads formed on the surface of an object to be mounted; vertically arranging conductive cylindrically-shaped receiving portions configured to detachably fit the columnar elements on lands formed on the surface of a packaging board; and inserting the columnar elements into the corresponding cylindrically-shaped receiving portions, respectively, thereby mounting the object to be mounted on the packaging board. Also, another example of the pertinent technique is disclosed in JPP (Kokai) 10-163267. The technique disclosed in this publication involves forming conductive portions having holes on pads of a base material; forcedly fitting bumps of workpieces into the holes; and engaging projections inwardly projecting in the upper portions of the conductive portions, with edges formed on the bumps, thereby preventing the bumps from being disengaged from the holes. Further, another example of the technique is disclosed in JPP (Kokai) 1-226160. The technique disclosed in this publication provides a terminal device for electronic component connection, formed by connecting electrodes of an electronic component to electrodes on a substrate, in which recesses and projections are provided by a photo-work method between the substrate and the electronic component to thereby form terminals to be connected to the electrodes. Then, of these terminals, the terminals on the part of the projections are fitted in the terminals on the part of the recesses.

As mentioned above, in the conventional electronic component device of the flip chip bonding type, the electrical connection between the chip and the package is accomplished by the bonding using the bumps made of the same metal, or the bonding using the bumps made of different metals. Generally, such an electronic component device undergoes, prior to shipment, an electrical test on its detailed functions (a product reliability evaluation) with the chip mounted on the package. However, the conventional electronic component device of the flip chip bonding type encounters problems as given below when subjected to such a test for reliability evaluation.

Specifically, the bonding using different metals involves the formation of an alloy layer at the bonding interface between the metals. For example, as shown in FIG. 9A, assuming that the bonding involves: providing solder bumps BP1 (containing tin (Sn) as the main metal) respectively on pad portions 52 (e.g., copper (Cu)/nickel (Ni)/gold (Au) plating layers) exposed from portions of a protection film 51 (e.g., a solder resist layer) of a wiring board 50; providing copper (Cu) bumps BP2 respectively on pad portions 62 (e.g., aluminum (Al) conductor layers) exposed from portions of a protection film 61 (e.g., a passivation film) of a chip 60; and bonding the metal bumps BP1 and BP2 together by melting or the like. In this case, alloy layers (Cu—Sn) BM are formed, respectively, at the bonding interfaces between the metal bumps BP1 and BP2.

The alloy layer BM has the following problems. Because of being generally brittle to thermal stress, the alloy layer BM may possibly break off under a temperature cyclic test (e.g., a test to determine a change in product characteristics caused by repeated cycles of changing the temperature in a range between a temperature of +125° C. to +150° C. and a temperature of −40° C. to −65° C.) after chip mounting. In some cases, "break-off" may possibly occur in the alloy layer BM (in a portion indicated by reference BR) as shown in FIG. 9A. Also, the alloy layer BM has another problem. When a high-temperature exposure test (e.g., a test in which device test target is left in an environment at a temperature of 150° C. for a given period of time) is performed, heat facilitates the flowing of atoms of metal, thus causing an enlargement of the area of the alloy layer BM, and in turn, an increase in the likelihood of occurrence of break-off.

Description is given with regard to the occurrence of "break-off," which takes place when the metal bumps BP1 and BP2 made of different metals are used to form a bond between the chip 60 and the wiring board 50, as shown in FIG. 9A. However, "break-off" in such a conductive bump can possibly occur likewise even in the case of bonding using the same metal. For instance, if any one of eutectic solder (made up of tin (Sn) and lead (Pb)) and lead-free solder (e.g., made up of Sn, silver (Ag) and Cu) is used as a material for the conductive bump, the same or similar break-off can possibly occur, depending on temperature conditions or testing time, because of distribution of Sn—Pb or Sn—Ag—Cu alloy in the conductive bump, although such a local alloy layer BM as is shown in FIG. 9A is not formed.

In order to cope with such "break-off," a method using an underfill resin for the fixing of the chip to be mounted and the wiring board is widely adopted. FIG. 9B shows an example of the case. As shown in FIG. 9B, bumps BP to function as electrode terminals provided on the chip 60 to be mounted (the pad portions 62 exposed from the protection film 61) are connected by flip chip bonding to the pad portions 52 exposed from the protection film 51 of the wiring board 50. Then, an underfill resin 70 is filled into a gap between the wiring board 50 and the chip 60, and cured in the gap. By this method, the reliability of connection is improved, since the chip 60 and the wiring board 50 are integrally formed via the underfill resin 70.

However, the following problems arise. The method requires a process for filling the underfill resin 70 into the gap between the wiring board 50 and the chip 60, and hence causes a problem of an increase in man-hours and a rise in cost. Additionally, baking (heat treatment), which is performed to cure the underfill resin 70, often leads to a shrinkage in the underfill resin 70, so that the wiring board 50 is warped at its edges toward a chip mounting surface, as shown in FIG. 9B, due to the fact that the coefficient of thermal expansion of the underfill resin 70 is different from that of the wiring board 50. Further, delamination of the chip 60 may possibly occur depending on the degree of warp, thus causing deterioration in the reliability of connection.

SUMMARY OF THE INVENTION

An object of the present invention is to provide a wiring board and a method of manufacturing the same, which are capable of, even if a stress is generated between the wiring board and an electronic component to be mounted due to a difference in the coefficient of thermal expansion therebetween, effectively absorbing the stress and thereby ensuring that electrical connection between the wiring board and the electronic component is maintained, and are also capable of substantially eliminating a warp in the wiring board after mounting and thereby contributing to a reduction in cost.

According to the fundamental aspect of the invention, there is provided a wiring board for use in mounting an electronic component, including: an external connection terminal of a cylindrical shape, in which an electrode terminal of the electronic component is fitted, wherein a portion of the external connection terminal is electrically connected to a pad portion formed on an electronic component mounting surface side of the wiring board, and the external connection terminal is curvedly formed in such a shape that an outer periphery of the electrode terminal comes into close contact with an inner periphery of the middle portion of the external connection terminal when the electrode terminal is inserted into the external connection terminal.

According to the configuration of the wiring board of the present invention, even if stress (thermal stress) is generated between the wiring board and the electronic component due to a difference in the coefficient of thermal expansion therebetween, for example, under a temperature cyclic test or the like after the mounting of the electronic component, and accordingly some misalignment between the relative positions of the wiring board and the electronic component occurs, the external connection terminal can undergo elastic deformation in accordance with the direction of the generated stress, while maintaining close contact with the electrode terminal. This is because the external connection terminal is curvedly formed in such a shape that the outer periphery of the electrode terminal is in close contact with the inner periphery of the middle portion of the external connection terminal when the electrode terminal is inserted into the external connection terminal. In other words, the external connection terminal can ensure that the electrical connection between the wiring board and the electronic component is maintained, while effectively absorbing the generated thermal stress.

Furthermore, this configuration eliminates the need for the use of an underfill resin as has been conventional with the prior art (see FIG. 9B) for the mounting of the electronic component on the wiring board, and can thus substantially eliminate a warp in the wiring board as has been conventionally found. Besides, this configuration eliminates the need for man-hours for filling the underfill resin, and can thus contribute to a reduction in cost.

According to another aspect of the invention, there is provided a method of manufacturing a wiring board, including: fabricating a wiring board body including a pad portion formed on an electronic component mounting surface side thereof; forming a sacrificial layer of a columnar shape to define the outer shape of an external connection terminal to be formed, on the pad portion of the wiring board body; curvedly shaping a side of the sacrificial layer of the columnar shape so that a middle portion thereof is constricted; forming a conductor layer of a cylindrical shape on the shaped side of the sacrificial layer, the conductor layer constituting the external connection terminal to be connected to the pad portion; and removing the sacrificial layer.

Also, according to still another aspect of the invention, there is provided a method of manufacturing a wiring board, including: fabricating a wiring board body including a pad portion formed on an electronic component mounting surface side thereof; forming a resist layer having an opening at a position corresponding to the pad portion, on the electronic component mounting surface side of the wiring board body; forming a first conductor layer in the opening of the resist layer at a higher temperature than room temperature, the first conductor layer constituting a portion of an external connection terminal to be formed; forming a second conductor layer on the first conductor layer at a higher temperature than room temperature, the second conductor layer being made of a material having a lower coefficient of thermal expansion than that of a material forming the first conductor layer; and removing the resist layer at room temperature.

Description is given with reference to the following embodiments of the invention, of other features in configuration or process of the wiring board and the method of manufacturing the same according to the present invention, and of characteristic advantages based on the features thereof, and the like.

DESCRIPTION OF THE PREFERRED EMBODIMENTS

Description is given below with regard to preferred embodiments of the present invention with reference to the accompanying drawings.

First Embodiment . . . see FIG. 1 to FIGS. 5A to 5D

Figure 1:
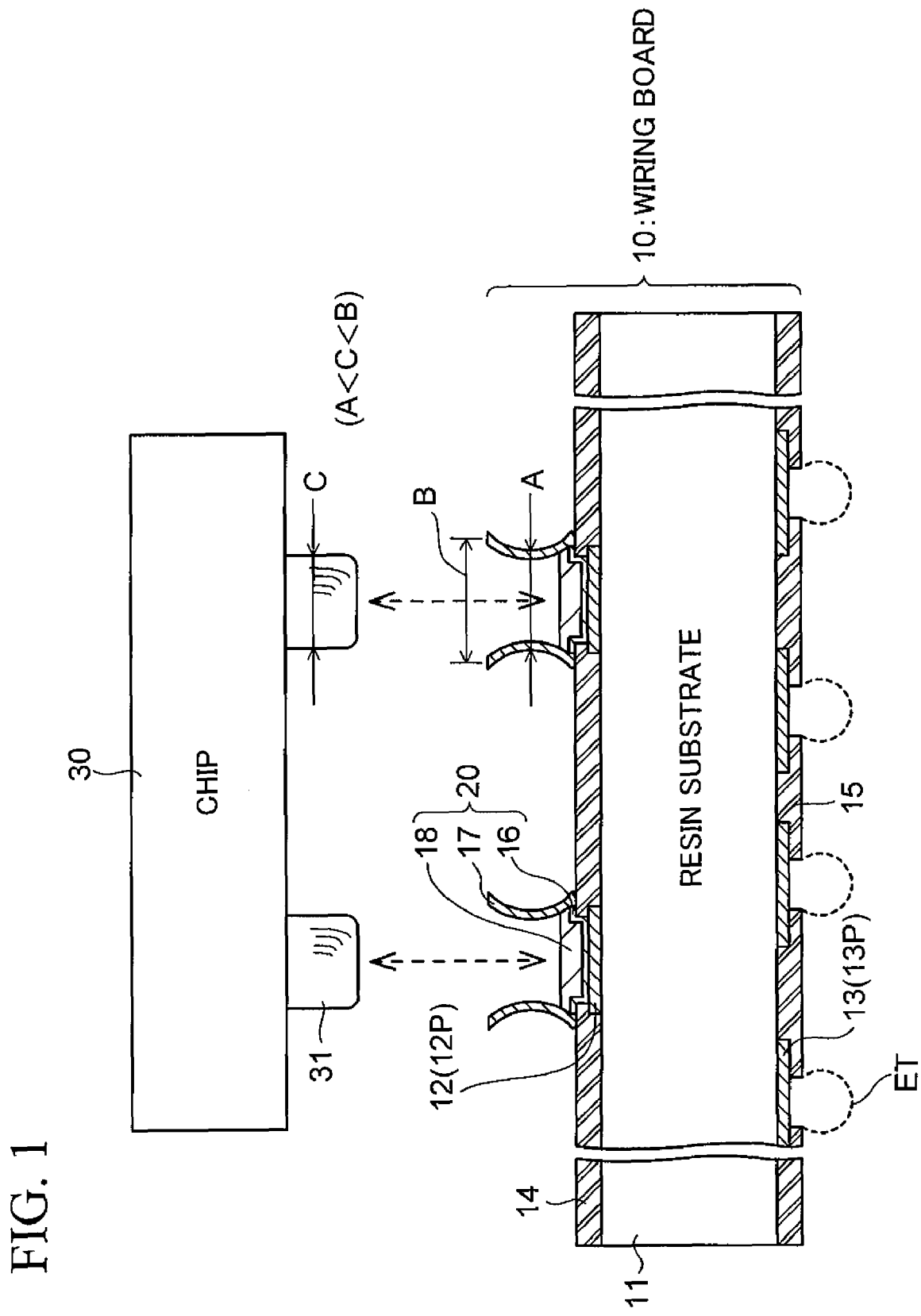
FIG. 1 is a sectional view showing the configuration of a wiring board according to a first embodiment of the present invention.

FIG. 1 shows in a sectional form the configuration of a wiring board according to a first embodiment of the present invention. As shown in FIG. 1, a wiring board 10 according to the embodiment is illustrated as being capable of detachably mounting a semiconductor chip 30 to function as an electronic component.

The wiring board 10 of this embodiment is basically configured by including a resin substrate 11 which forms a wiring board body; wiring layers 12 and 13 formed by patterning in desired layouts on both surfaces, respectively, of the resin substrate 11; and insulating layers 14 and 15 to function as protection films, formed to cover both surfaces exclusive of pad portions 12P and 13P defined in desired positions of the wiring layers 12 and 13, respectively. Further, the wiring board 10 is provided with external connection terminals 20 characterizing the present invention, in desired positions on the insulating layer (the upper insulating layer 14 in the illustrated example) on the chip mounting surface side.

As shown in FIG. 1, the external connection terminal 20 is formed of a conductor layer (or a base portion) 16 electrically connected to the pad portion 12P exposed from the insulating layer 14; a conductor layer (or a cylindrically-shaped conductor portion) 17 shaped in the form of a cylinder and electrically connected to a peripheral portion of the base portion 16 extending onto the insulating layer 14; and a conductor layer (a reinforcing portion) 18 provided to join together the base portion 16 and the cylindrically-shaped conductor portion 17 in the vicinity of the bottom of the inside of the cylindrically-shaped conductor portion 17. The cylindrically-shaped conductor portion 17 which constitutes a principal part of the external connection terminal 20, as viewed in a cross section from above although not specifically shown, is formed in the shape of a "circular ring" in accordance with the shape of an electrode terminal 31 of the chip 30 to be mounted ("columnar shape" as employed in this embodiment). Also, the cylindrically-shaped conductor portion 17, as viewed in a cross section from the side as shown in FIG. 1, is curvedly formed so that the diameter of the middle portion of the cylindrically-shaped conductor portion 17 (the portion corresponding to one half of its height in the height direction) is smaller than that of any other portion, i.e., so that the cylindrically-shaped conductor portion 17 is "constricted" in the middle portion. The external connection terminal 20 is hereinafter also referred to as "cylindrically-shaped terminal" for the sake of convenience, since its external shape looks like the shape of a "cylinder".

In other words, the cylindrically-shaped terminal (the external connection terminal) 20 is configured so that the base portion 16 constituting a portion of the cylindrically-shaped terminal 20 is electrically connected to the pad portion 12P exposed from the insulating layer 14, and so that the cylindrically-shaped conductor portion 17 constituting the principal portion of the cylindrically-shaped terminal 20 is curvedly formed in such a shape that the outer periphery of the electrode terminal 31 is in close contact with the inner periphery of the middle portion of the cylindrically-shaped conductor portion 17 when the electrode terminal 31 of the chip 30 to be mounted is inserted into the cylindrically-shaped terminal 20. In this embodiment, in order to ensure such close contact, a particular relationship is employed between the dimensions of each portion of the cylindrically-shaped conductor portion 17 and the dimensions of the electrode terminal 31 of the chip 30, as shown in FIG. 1. Specifically, the values of A, B and C are selected to satisfy the following relationship: A(e.g.,50 µm)<C(e.g.,100 µm)<B(e.g.,150 µm), where A represents the diameter of the middle portion of the cylindrically-shaped conductor portion 17; B represents the diameter of an opening portion of the cylindrically-shaped conductor portion 17 as the receiving side on which the electrode terminal 31 of the chip 30 is inserted; and C represents the diameter of the electrode terminal 31 of the chip 30.

In this embodiment as mentioned above, the electrode terminal 31 of the chip 30 to be mounted is inserted into the cylindrically-shaped terminal (the external connection terminal) 20 of the wiring board 10 so that the terminals 20 and 31 are connected in engagement with each other. In other words, electrical connection between the cylindrically-shaped terminal 20 of the wiring board 10 and the electrode terminal 31 of the chip 30 is ensured by providing contact by detachable and mechanical fitting as shown in FIG. 1, rather than by providing fixed connection using melting or bonding of a material for bump formation (such as solder), or the like, such as has been conventionally employed.

By such a structure of the cylindrically-shaped terminal 20, even if stress (thermal stress) is generated in an up/down or lateral direction due to a difference in the coefficient of thermal expansion between the wiring board 10 and the chip 30 under a temperature cyclic test or the like after chip mounting, and accordingly some misalignment between the relative positions of the wiring board 10 and the chip 30 occurs, the cylindrically-shaped terminal 20 (cylindrically-shaped conductor portion 17) can undergo elastic deformation in accordance with the direction of the generated stress, while maintaining close contact with the electrode terminal 31. This is because the cylindrically-shaped terminal 20 (the cylindrically-shaped conductor portion 17) is shaped in such a form that the electrode terminal 31 of the chip 30 can be detachably inserted and fitted into the cylindrically-shaped terminal 20. In other words, the cylindrically-shaped terminal 20 has the function (stress release function) to effectively absorb the thermal stress generated under the temperature cyclic test or the like after the chip mounting.

Figure 2A:
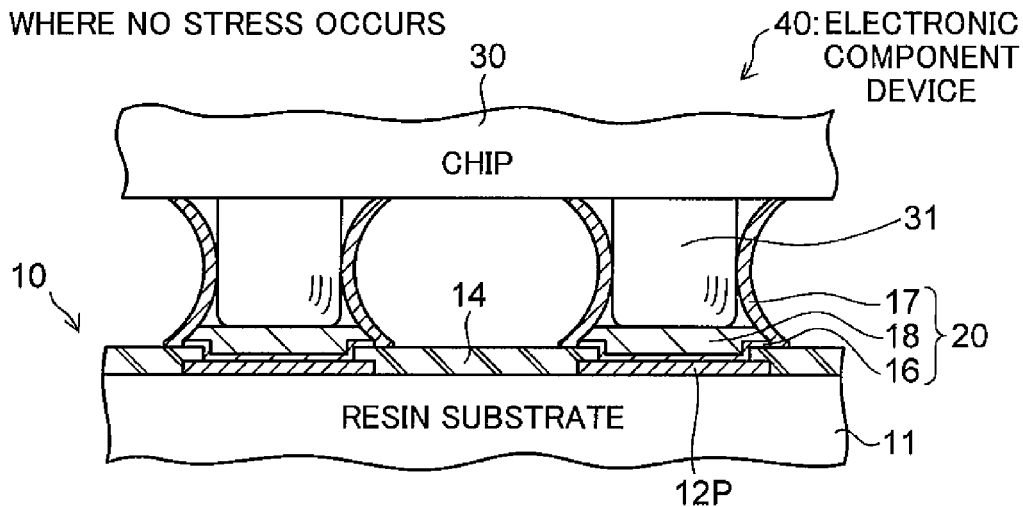
FIGS. 2A, 2B and 2C are views showing the wiring board shown in FIG. 1 with a chip (or an electronic component) mounted thereon (an electronic component device) under a non-stress condition, under an up/down stress condition, and under a lateral stress condition, respectively.
Figure 2B:
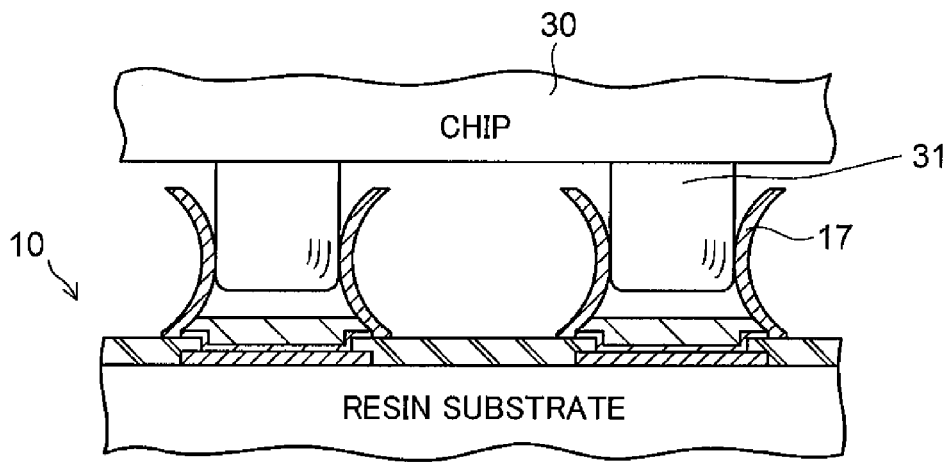
Figure 2C:
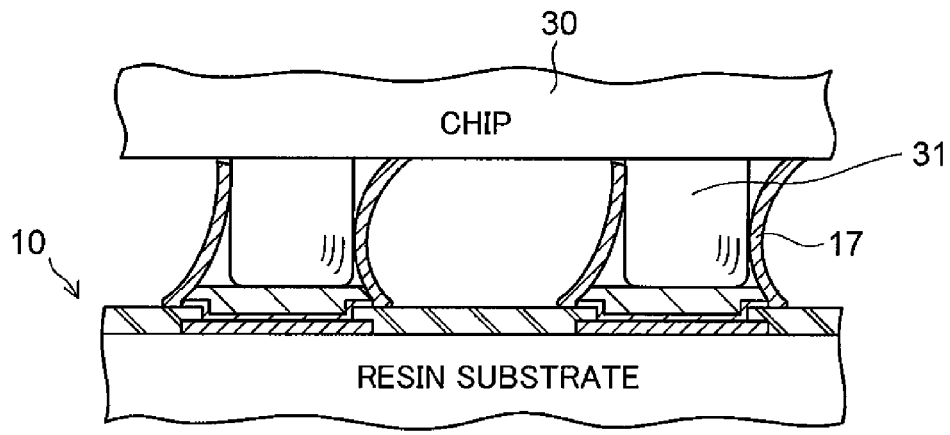

FIGS. 2A to 2C illustrate in a schematic form the effect of the stress release function, and show the wiring board 10 with the chip (the electronic component) 30 mounted thereon (an electronic component device 40), before the temperature cyclic test or the like (under a non-stress condition), under an up/down stress condition, and under a lateral stress condition, respectively. Provided that the condition shown in FIG. 2A is an original mounting condition, even if there is some misalignment between the relative positions of the wiring board 10 and the chip 30 due to the stress generated in the up/down or lateral direction as shown in FIG. 2B or 2C, the cylindrically-shaped conductor portion 17 can undergo elastic deformation as shown in FIG. 2B or 2C to thereby reliably maintain the close contact between the inner periphery of the middle portion of the cylindrically-shaped conductor portion 17 and the outer periphery of the electrode terminal 31 of the chip 30 (a mounting condition where the electrical connection therebetween is still maintained).

Referring again to FIG. 1, an external connection terminal (such as a metal bump (ball) ET as shown by a dashed line in FIG. 1 or a metal pin) for use in mounting the wiring board 10 on a motherboard such as a printed wiring board (a packaging board) is bonded via a solder or the like to the pad portion 13P exposed from the insulating layer 15 on the side opposite to the chip mounting surface side. Such an external connection terminal may be provided at the time of shipment, or the pad portion 13P may remain exposed so that at a later stage the external connection terminal can be bonded to the pad portion 13P when necessary. In this instance, the surface of the pad portion 13P is subjected to certain processing such as nickel (Ni) and gold (Au) plating.

Also, the resin substrate 11 which forms the wiring board body of the wiring board 10 may be in any form, provided that it is the substrate having the wiring layer on the outermost layer, in which the wiring layers are electrically connected through the resin substrate. The wiring layer may be formed or not formed within the resin substrate 11. Since the resin substrate 11 is not a portion characterizing the present invention, detailed illustration is omitted. For example, in the case of the form in which the wiring layers are formed in the resin substrate 11, the outermost wiring layers are electrically connected through wiring layers formed via insulating layers within the substrate, and through via holes through which the wiring layers are interconnected. The form of the substrate includes, for example, a wiring substrate with multilayer structure which can be formed by a build-up method. On the other hand, in the case of the form in which the wiring layers are not formed in the resin substrate 11, the outermost wiring layers are electrically connected via through holes appropriately formed in desired portions of the resin substrate 11.

As shown in FIGS. 1 and 2A to 2C, the wiring board 10 of this embodiment is characterized by including the cylindrically-shaped terminal (the external connection terminal) 20 to receive the electrode terminal 31 (electronic component) of the chip 30 to be mounted, and in that the cylindrically-shaped terminal (the external connection terminal) 20 is configured so that the base portion 16 constituting a portion of the cylindrically-shaped terminal 20 is electrically connected to the pad portion 12P exposed from the insulating layer 14, and so that the cylindrically-shaped conductor portion 17 constituting the principal portion of the cylindrically-shaped terminal 20 is curvedly formed in such a shape that the outer periphery of the electrode terminal 31 is in close contact with the inner periphery of the middle portion of the cylindrically-shaped conductor portion 17 when the electrode terminal (a cylindrical conductor bump 31) of the chip 30 to be mounted is inserted into the cylindrically-shaped terminal 20. Description is given specifically with regard to materials for structural members which constitute the wiring board 10 according to the embodiment, the sizes thereof, and so on, in association with the following process.

Description is given with regard to a method of manufacturing the wiring board 10 according to the embodiment with reference to FIGS. 3A to 5D showing in order manufacturing steps thereof. Incidentally, for simplicity of illustration, examples shown in figures of respective manufacturing steps only show the configuration of the portions related to the present invention (the cylindrically-shaped terminal 20 and its peripheral portions), namely, the chip mounting surface side of the wiring board.

First, at the first step (see FIG. 3A), the wiring board at a stage before the formation of the cylindrically-shaped terminal 20 characterizing the present invention is fabricated. Specifically, a structure including a resin substrate 11 which forms a wiring board body; wiring layers 12 and 13 (see FIG. 1) patterned in desired layouts on both surfaces, respectively, of the resin substrate 11; and insulating layers 14 and 15 (see FIG. 1) to function as protection films, formed to cover both surfaces exclusive of pad portions 12P and 13P (see FIG. 1) defined in desired positions of the wiring layers 12 and 13, respectively, is fabricated.

As mentioned above, the resin substrate 11 which forms the wiring board body of the wiring board 10 may be in any form, provided that it is the substrate having the wiring layer on the outermost layer, in which the wiring layers are electrically connected through the resin substrate. For example, a wiring substrate of multilayer structure obtained by a build-up method may be used. A typical manufacturing process is to repeat, in turn, formation of an insulating layer, formation of a via hole in the insulating layer, and formation of a wiring pattern (a wiring layer) inclusive of the inside of the via hole, on each surface of a core substrate serving as a base material, thereby yielding a build-up structure. An epoxy resin is typically used as a material for the insulating layer, and copper (Cu) is typically used as a material for the wiring layer. The outermost wiring layers 12 and 13 formed through the above process are electrically connected through wiring layers formed in the desired locations within the substrate, and through the via holes through which the wiring layers are interconnected.

Since the external connection terminals (a portion of the cylindrically-shaped terminal 20, and solder balls ET for use in mounting on a motherboard or the like) are bonded to the pad portions 12P and 13P (FIG. 1) defined in the desired positions of the outermost wiring layers 12 and 13, it is desirable that the wiring layers (Cu) 12 and 13 be given nickel (Ni) plating and gold (Au) plating in this order. This is for the purpose of improving contact characteristics when the external connection terminals are bonded, and enhancing adhesion between the Cu layer which forms the pad portions 12P and 13P, and the Au layer, and thereby preventing diffusion of Cu into the Au layer. In other words, the pad portions 12P and 13P have a three-layer structure of Cu, Ni and Au.

Further, the insulating layers (the solder resist layers) 14 and 15 (see FIG. 1) to function as protection films are formed on both surfaces of the resin substrate 11. The formation of the insulating layers 14 and 15 can be accomplished, for example, by applying photosensitive epoxy resin to the resin substrate 11 and the wiring layers 12 and 13, and subjecting the resin layers to patterning in desired shapes (the shape exclusive of the pad portions 12P and 13P of the wiring layers 12 and 13).

At the next step (see FIG. 3B), a seed layer 16 used as a power feed layer for electroplating in a later step is formed all over the surface of the resin substrate 11 on the chip mounting surface side. For example, the formation of the seed layer 16 is accomplished by forming a conductor layer of titanium (Ti) with a thickness of about 0.1 µm by sputtering all over the surface (on the insulating layer 14 and the pad portion 12P) on the chip mounting surface side, then forming a conductor layer of platinum (Pt) with a thickness of about 0.3 µm on the Ti layer by sputtering, and further forming a conductor layer of gold (Au) with a thickness of about 0.2 μm on the Pt layer by sputtering, thereby yielding the seed layer 16 having a three-layer structure of Ti, Pt and Au.

At the next step (see FIG. 3C), a plating resist is formed on the seed layer 16 using a patterning material, and an opening is formed in a desired position (namely, a resist layer R1 having an opening OP1 is formed). The opening OP1 is formed by patterning in accordance with the layout of the desired pattern to be formed, namely, the outer shape of the cylindrically-shaped conductor portion 17 of the cylindrically-shaped terminal 20 (the diameter B of the opening portion on the receiving side on which the electrode terminal 31 of the chip 30 is inserted). A photosensitive dry film or a liquid photoresist (e.g., a liquid resist such as a novolak-base resin or an epoxy-base resin) may be used as the pattering material.

For example, where the dry film which has a resist material sandwiched between a polyester cover sheet and a polyethylene separator sheet is used, the resist layer R1 is formed by patterning through the following steps: surface cleaning, lamination preprocess (separator sheet delamination), resist lamination in the air, exposure, cover sheet delamination, and development. Specifically, the formation of the resist layer R1 involves: first cleaning the surface of the seed layer 16; then laminating the dry film (having a thickness of about 120 μm) on the surface of the seed layer 16 by thermocompression bonding; curing the dry film by subjecting the dry film to exposure under ultraviolet (UV) irradiation using a mask (not shown) formed in the shape of the desired wiring pattern by patterning; and further, etching away a corresponding portion (forming the opening OP1) using a predetermined developing solution (an organic-solvent-containing developing solution for a negative resist, or an alkali-base developing solution for a positive resist), thereby yielding the resist layer R1 according to the desired shape of the wiring pattern. Where the liquid photoresist is used, the resist layer R1 can be likewise formed in the desired shape by patterning through process steps of: surface cleaning; resist coating on the surface; drying; exposure; and development.

At the next step (see FIG. 3D), a conductor layer 18 is formed on the seed layer 16 exposed from the opening OP1 (FIG. 3C) in the resist layer R1, by electroplating using the seed layer 16 as the power feed layer. In this embodiment, the seed layer 16 is electroplated with copper (Cu) to form the conductor layer (Cu post) 18 of about 100 μm thickness.

The conductor layer 18 is used as a sacrificial layer to define the outer shape of the cylindrically-shaped conductor portion 17 of the cylindrically-shaped terminal 20, and the major portion of the conductor layer 18 is etched away as is described later. Also, a finally remaining portion of the conductor layer 18 is used as the reinforcing portion for improving the connection between the pad portion 12P and the cylindrically-shaped conductor portion 17 via the base portion 16 of the cylindrically-shaped terminal 20.

Figure 4A:
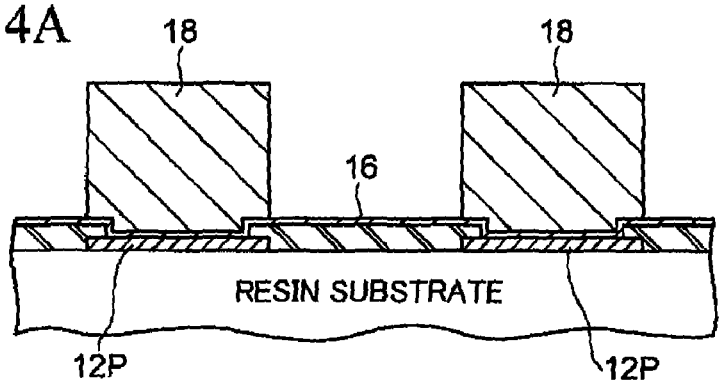
FIGS. 4A to 4D are sectional views showing steps following the steps shown in FIGS. 3A to 3D.

At the next step (see FIG. 4A), the plating resist (the resist layer R1 shown in FIG. 3D) is removed. For example, where the dry film is used as the plating resist, an alkaline chemical liquid such as sodium hydroxide or a monoethanolamine-base liquid can be used for removal. Also, where the liquid resist such as the novolak-base resin or the epoxy-base resin is used as the plating resist, acetone, alcohol or the like can be used for removal. Thereby, the conductor layer (Cu post) 18 and the seed layer 16 are exposed. At this stage, the pad portions 12P are electrically interconnected via the seed layer 16, as shown in FIG. 4A.

Figure 4B:
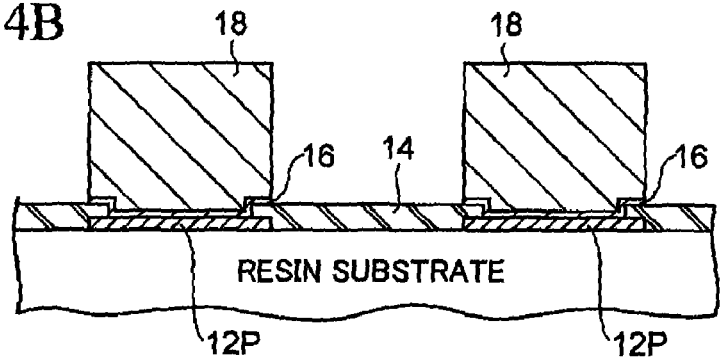
Figure 4C:
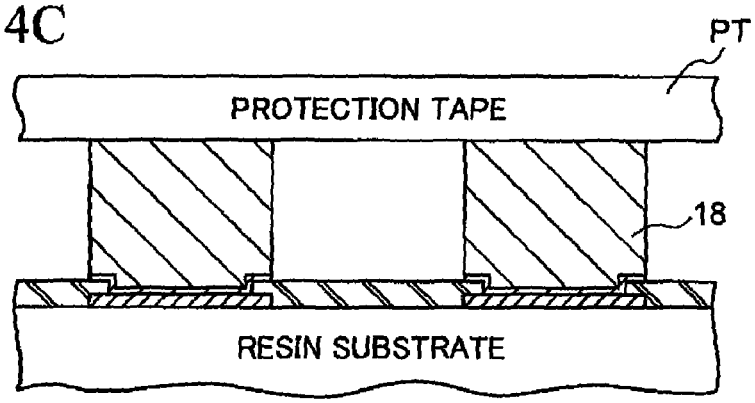

At the next step (see FIG. 4B), the exposed seed layer 16 (FIG. 4A) is selectively removed with respect to the conductor layer 18. Specifically, the selective etching of the exposed seed layer (Ti/Pt/Au) 16 alone can be accomplished by first performing wet etching using a chemical liquid soluble only in gold (Au), using the conductor layer 18 made of copper (Cu) as a mask; then performing wet etching using a chemical liquid soluble only in platinum (Pt); and further performing wet etching using a chemical liquid soluble only in titanium (Ti). Thereby, the insulating layer 14 is exposed directly under the removed seed layer 16. At this stage, the pad portions 12P are insulated from each other as shown in FIG. 4B.

At the next step (see FIG. 4C), a protective tape PT is applied to the top surface of the conductor layer (Cu post) 18. The protective tape PT is for the purpose of preventing the top surface of the conductor layer (Cu post) 18 from being etched away at the time of etching of only the side thereof at the next step. For example, a sheet base material made of polyolefine, polyester, PET (polyethylene terephthalate), or the like with an acrylic adhesive applied to one surface thereof may be used as the protective tape PT.

Figure 4D:
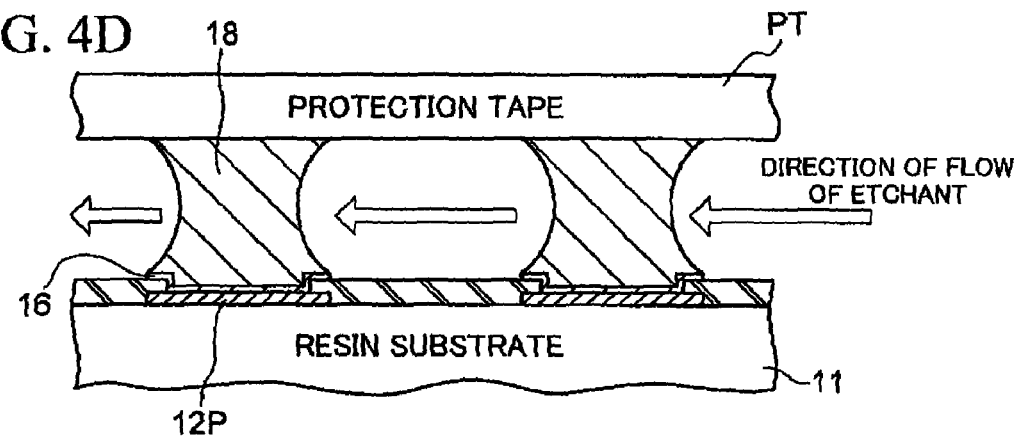

At the next step (see FIG. 4D), the conductor layer (Cu post) 18 whose top has the protective tape PT laminated thereto and whose overall underside is connected via the seed layer 16 to the pad portion 12P on the resin substrate 11 is shaped in a desired shape (i.e., the circumference shape of the cylindrically-shaped conductor portion 17 of the cylindrically-shaped terminal 20) by etching the side of the conductor layer 18. For example, the middle portion of the Cu post 18 is etched in a constricted shape as shown in FIG. 4D by immersing this workpiece in a processing tank containing a cupric chloride etchant, and causing the etchant to flow in the direction of the arrow shown in FIG. 4D. On that occasion, since there is generally a correlation between the etching rate and etching time inherent in the etchant for use, control of the etching rate based on the etching time enables etching the side of the Cu post 18 in a desired shape.

Figure 5A:
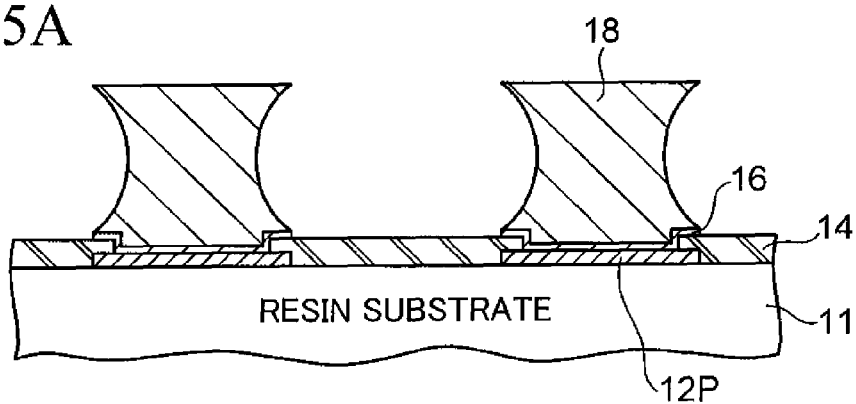
FIGS. 5A to 5D are sectional views showing steps following the steps shown in FIGS. 4A to 4D.

At the next step (see FIG. 5A), the protective tape PT (FIG. 4D) is delaminated. This results in fabrication of a structure in which the conductor layer (Cu post) 18 which is "constricted" in the middle portion is connected to the pad portion 12P on the resin substrate 11 via the seed layer 16 throughout the overall underside thereof, as shown in FIG. 5A.

Figure 5B:
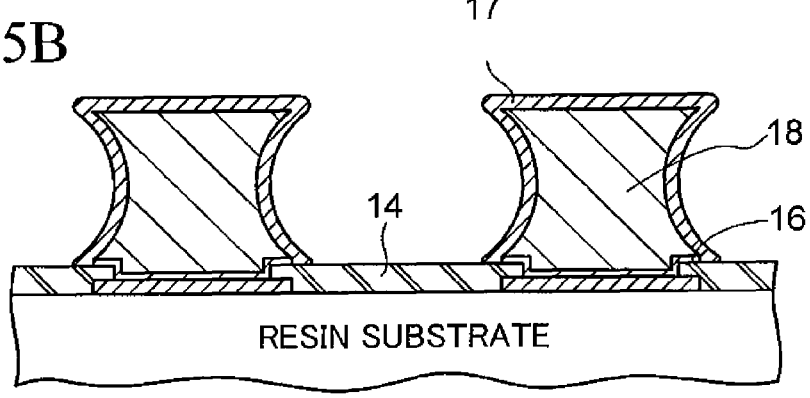

At the next step (see FIG. 5B), a plating film to form the cylindrically-shaped conductor portion 17 of the cylindrically-shaped terminal 20 (FIG. 1) characterizing the present invention is formed on the surface of the conductor layer (Cu post) 18 which is "constricted" in the middle portion. The formation of the plating film is accomplished, for example, by forming a conductor layer of nickel (Ni) with a thickness of about 10 μm on the surface of the conductor layer (Cu post) 18 by electroless plating; and further forming a conductor layer of gold (Au) with a thickness of about 0.5 μm on the Ni layer by electroless plating, thereby yielding the plating film 17 having two-layer structure of Ni/Au. A lower end portion of the plating film 17 is electrically connected to the peripheral portion of the seed layer (the base portion) 16 extending onto the insulating layer 14, as shown in FIG. 5B. Incidentally, the reason why the plating film 17 is given Au plating on the surface thereof is that the plating permits selective etching of the sacrificial layer (Cu post) 18.

Figure 5C:
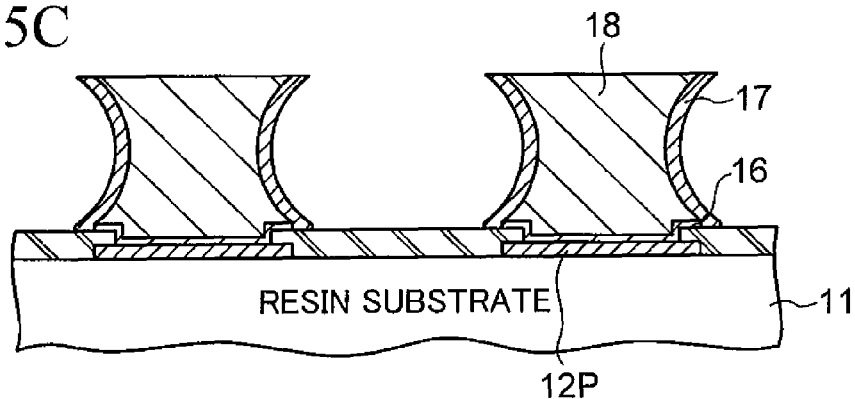

At the next step (see FIG. 5C), only the plating film 17 formed on the top surface thereof is removed from the sacrificial layer (Cu post) 18 with the plating film 17 formed on the surface. For example, polishing using chemical mechanical polishing (CMP) continues until an upper end surface of the conductor layer 18 is exposed as shown in FIG. 5C.

Figure 5D:
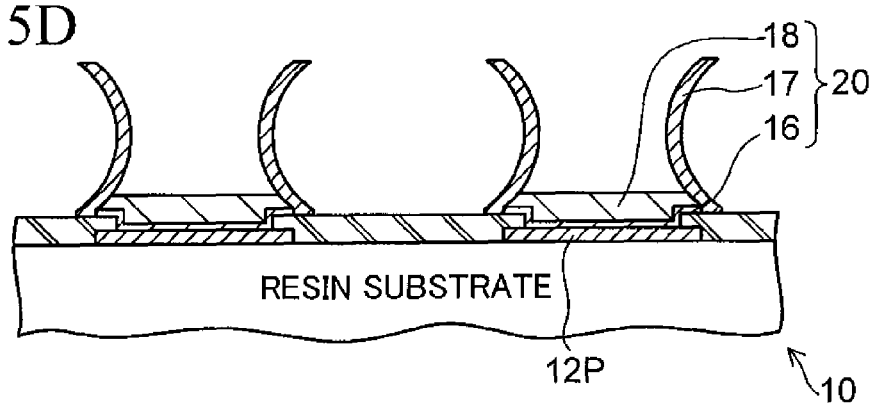
Figure 6A:
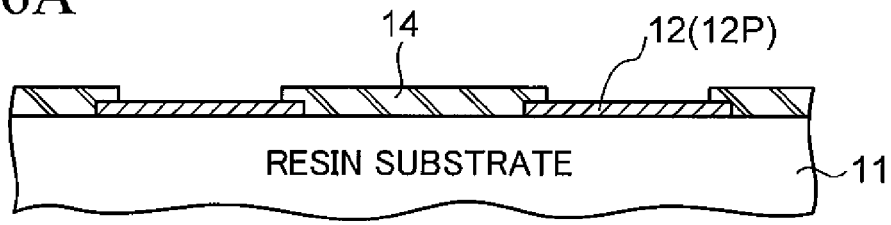
FIGS. 6A to 6D are sectional views showing steps in a method of manufacturing a wiring board according to a second embodiment of the present invention.
Figure 6B:
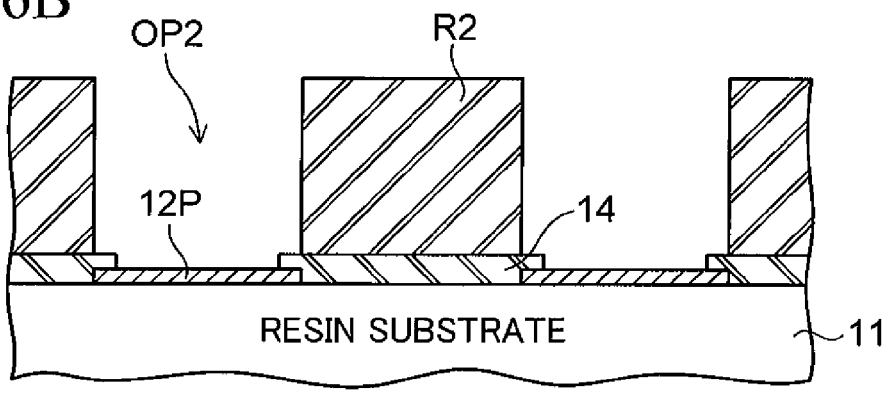
Figure 6C:
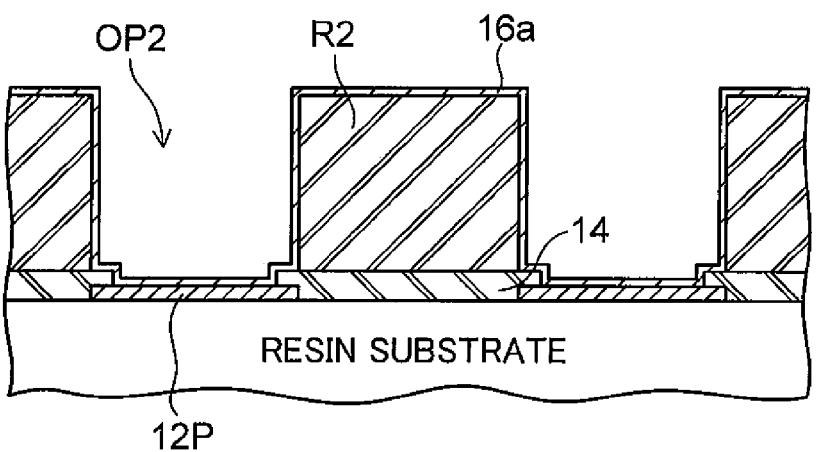
Figure 6D:
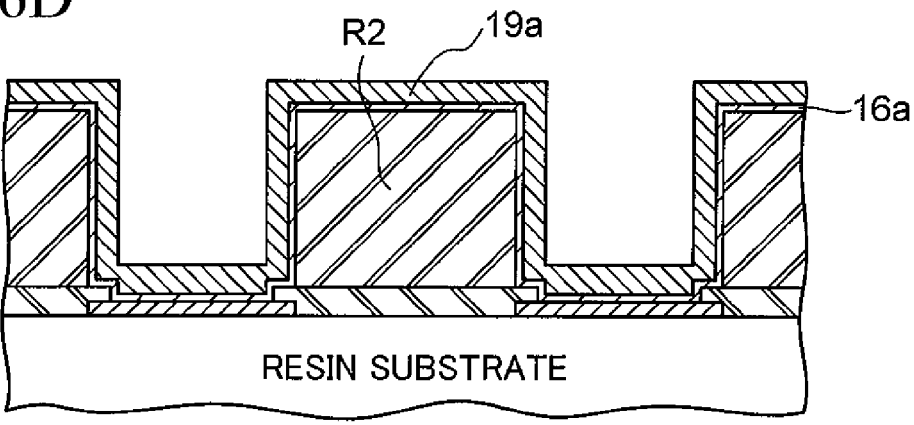

At the final step (see FIG. 5D), the conductor layer (Cu post) 18 used as the sacrificial layer is etched away. On that occasion, etching is performed in such a manner that a portion of the conductor layer remains as shown in FIG. 5D (e.g., about ⅕ of the total thickness, specifically, a thickness of about 20 μm). For example, a portion of the conductor layer 18 can be left as shown in FIG. 5D by immersing this workpiece in a processing tank containing a cupric chloride etchant, and controlling the etching rate based on the etching time, as in the case of the process performed at the step shown in FIG. 4D. The remaining portion of the conductor layer 18 functions as the reinforcing portion for improving the connection between the base portion 16 on the pad portion 12P and the cylindrically-shaped conductor portion 17, as mentioned above.

The above steps result in the manufacture of the wiring board 10 (FIG. 1) according to the present embodiment.

As described above, according to the wiring board 10 and the method of manufacturing the same according to the embodiment, even if stress (thermal stress) is generated in an up/down or lateral direction due to a difference in the coefficient of thermal expansion between the wiring board 10 and the chip 30 under a temperature cyclic test or the like after chip mounting, and accordingly some misalignment between the relative positions of the wiring board 10 and the chip 30 occurs, the cylindrically-shaped terminal 20 (cylindrically-shaped conductor portion 17) can undergo elastic deformation in accordance with the direction of the generated stress, while maintaining close contact with the electrode terminal 31 (see FIG. 2). This is because the cylindrically-shaped terminal 20 (the cylindrically-shaped conductor portion 17) is curvedly formed in such a shape that the outer periphery of the electrode terminal 31 is in close contact with the inner periphery of the middle portion of the cylindrically-shaped conductor portion 17 when the electrode terminal 31 of the chip 30 is inserted into the cylindrically-shaped terminal 20. In other words, the cylindrically-shaped terminal 20 can ensure that the electrical connection between the wiring board 10 and the chip 30 mounted thereon is maintained, while effectively absorbing the generated thermal stress (performing the stress release function).

Figure 9A:
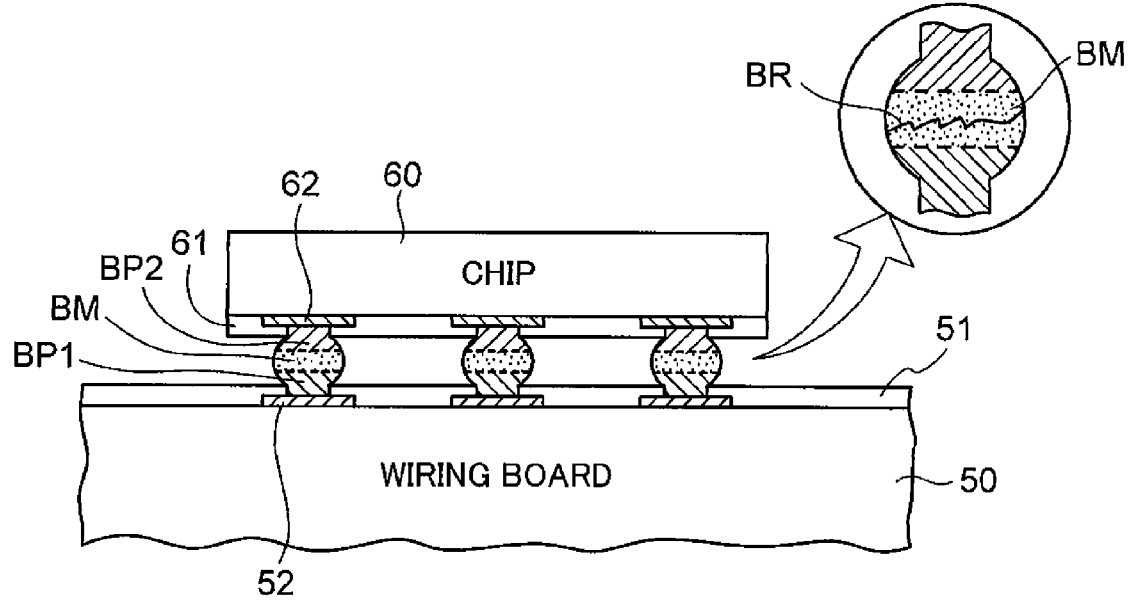
FIGS. 9A and 9B are views for explaining problems involved in the prior art chip mounting.
Figure 9B:
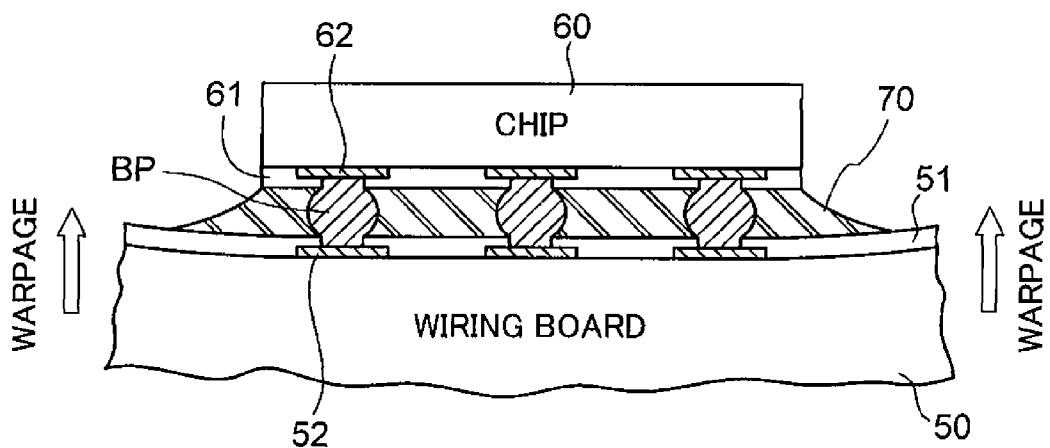

Moreover, this configuration eliminates the need for the use of an underfill resin such as has been used in the prior-art chip mounting for the mounting of the chip 30 on the wiring board 10, and thus enables substantially eliminating a disadvantage (a warp in the wiring board) such as has been encountered in the prior art (see FIG. 9B). Also, this configuration eliminates man-hours for filling the underfill resin, and thus enables contributing to a reduction in cost.

Also, a portion of the sacrificial layer (the conductor layer) 18 left at the final step (FIG. 5D) functions as the reinforcing portion to join together the base portion 16 and the cylindrically-shaped conductor portion 17 in the vicinity of the bottom of the inside of the cylindrically-shaped conductor portion 17, and therefore this leads to an improvement in the connection between the pad portion 12P and the cylindrically-shaped conductor portion 17 via the base portion 16.

For the wiring board 10 and the method (FIGS. 3A to 5D) of manufacturing the same according to the above-mentioned first embodiment, description is given taking the case where the cylindrically-shaped terminal (the external connection terminal) 20 characterizing the present invention is formed by utilizing the sacrificial layer (the Cu post) 18 shaped in advance in a constricted form in the middle portion in accordance with the outer shape of the cylindrically-shaped terminal (the external connection terminal) 20. However, of course, it will be understood that a method of forming the cylindrically-shaped terminal is not limited to this, as is also apparent from the gist of the present invention. FIGS. 6A to 8B show an example of the method.

Figure 8A:
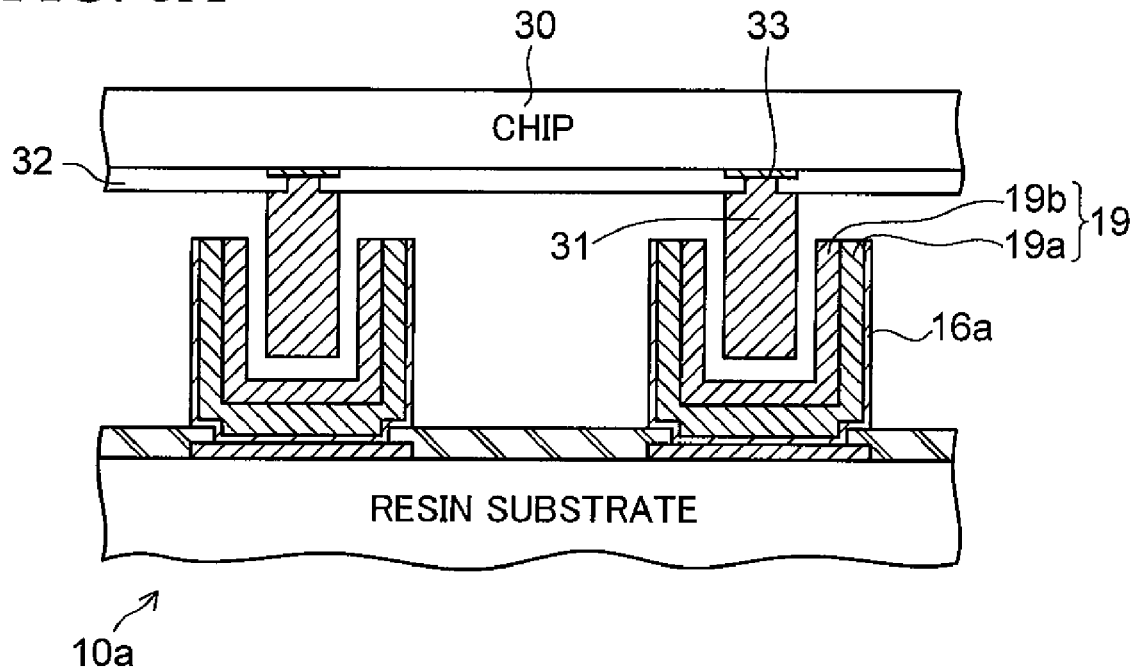
FIGS. 8A and 8B are sectional views showing steps in a method of mounting the chip (or the electronic component) on the wiring board according to the second embodiment of the present invention (or a method of manufacturing the electronic component device)
Figure 8B:
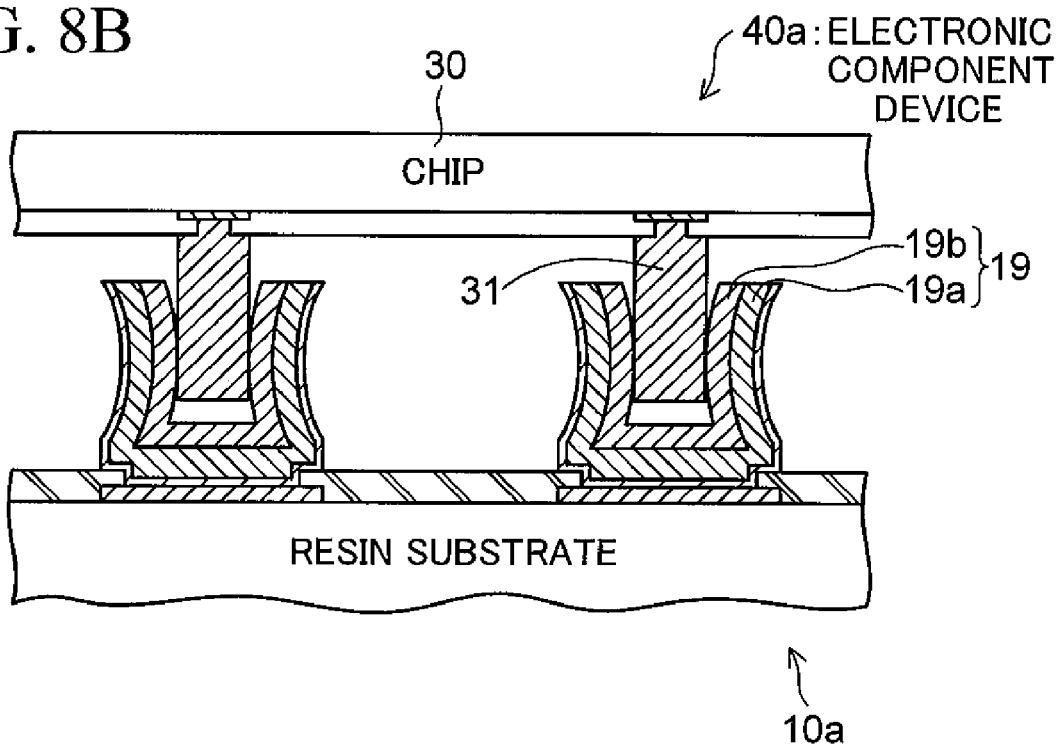

Second Embodiment . . . see FIGS. 8A to 8B

A wiring board 10a according to a second embodiment (see FIG. 7C) has basically the same configuration as the wiring board 10 according to the first embodiment (FIG. 1), but is different in that the wiring board 10a is provided with a cylindrically-shaped terminal (an external connection terminal) 20a having a different configuration from the first embodiment in a desired position on the insulating layer 14 on the chip mounting surface side. As shown in FIG. 7C, the cylindrically-shaped terminal 20a consists of a conductor layer (a base portion) 16a whose portion (bottom) is electrically connected to the pad portion 12P exposed from the insulating layer 14 and which is curvedly formed in the shape of a cylinder; and a conductor layer (a cylindrically-shaped conductor portion) 19 of two-layer structure coating the overall inner surface of the cylindrically-shaped base portion 16a.

The shapes of the cylindrically-shaped conductor portion 19, as viewed in cross sections from above and the side, respectively, are the same as those of the cylindrically-shaped conductor portion 17 according to the first embodiment. Specifically, the cylindrically-shaped conductor portion 19, as viewed in a cross section from above, is formed in the shape of a "circular ring," and as viewed in a cross section from the side, is formed so that the diameter of the middle portion thereof (the portion corresponding to one half of its height in the height direction) is smaller than that of any other portion, i.e., so that the cylindrically-shaped conductor portion 19 is "constricted" in the middle portion. Also, the relationship between the dimensions of each portion of the cylindrically-shaped conductor portion 19 (the diameter A of the middle portion thereof and the diameter B of the opening portion thereof) and the dimensions of the electrode terminal of the chip to be mounted (the diameter C) is such that the A, B and C values are selected to satisfy the following relationship: A<C<B, as in the case of the first embodiment.

The cylindrically-shaped conductor portion 19 characterizing the second embodiment has a structure formed by laminating conductor layers 19a and 19b made of metals having different coefficients of thermal expansion, and constitutes "bimetal." In this embodiment, metallic materials are selected so that the relationship between the coefficients of thermal expansion of the metals constituting the bimetal (the cylindrically-shaped conductor portion 19) is such that the coefficient of thermal expansion of the outer metal (the conductor layer 19a) is higher than that of the inner metal (the conductor layer 19b).

As shown in FIGS. 7C and 8B, the wiring board 10a according to the embodiment is characterized by including the cylindrically-shaped terminal (the external connection terminal) 20a to receive the electrode terminal 31 of the chip (the electronic component) 30 to be mounted, and is characterized in that the base portion 16a which constitutes a portion of the cylindrically-shaped terminal 20a is electrically connected to the pad portion 12P exposed from the outermost insulating layer 14 on the electronic component mounting surface side, and in that the metallic materials (19a and 19b) constituting the cylindrically-shaped conductor portion (the bimetal) 19 being the principal portion of the cylindrically-shaped terminal 20a are selected so that the outer periphery of the electrode terminal 31 is in close contact with the inner periphery (the conductor layer 19b) of the middle portion of the cylindrically-shaped conductor portion 19 at room temperature (around 23° C.) when the electrode terminal 31 of the chip 30 is inserted into the cylindrically-shaped terminal 20a. Description is given specifically with regard to materials for structural members which constitute the wiring board 10a according to the embodiment, the sizes thereof, and so on, in connection with the following process.

Description is given below with regard to a method of manufacturing the wiring board 10a according to the second embodiment with reference to FIGS. 6A to 7C showing manufacturing steps in order. As in the case of the process according to the above-mentioned first embodiment (see FIGS. 3A to 5D), for simplicity of illustration, there is shown only the configuration of the portions related to the present invention (namely, the cylindrically-shaped terminal 20a and its peripheral portions).

First, at the first step (see FIG. 6A), the wiring board at a stage before the formation of the cylindrically-shaped terminal 20a characterizing the present invention is fabricated. Since a fabrication method for the wiring board is the same as the above-mentioned process performed at the step shown in FIG. 3A, description thereof is omitted.

Figure 3A:
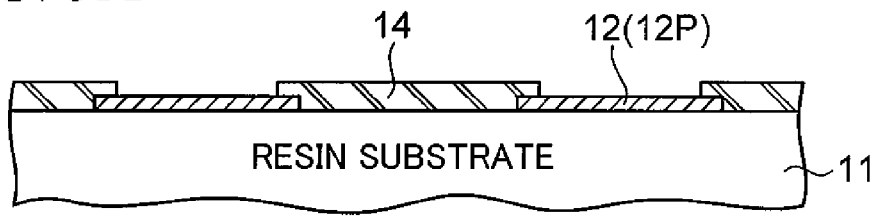
FIGS. 3A to 3D are sectional views showing steps in a method of manufacturing the wiring board shown in FIG. 1.
Figure 3B:
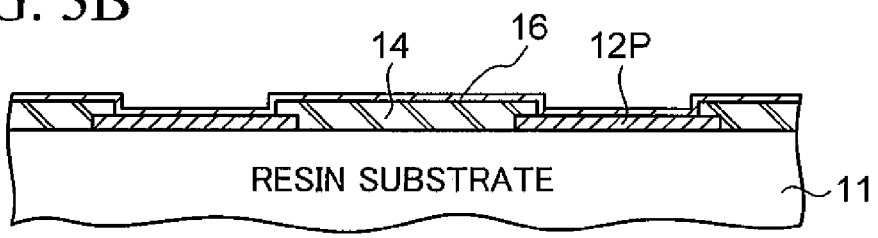
Figure 3C:
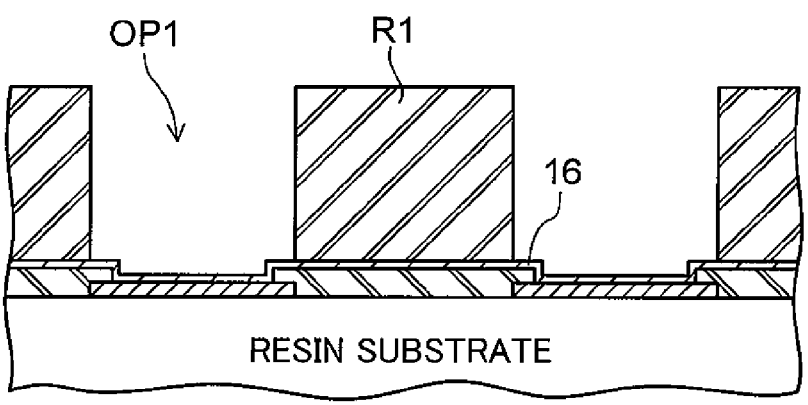
Figure 3D:
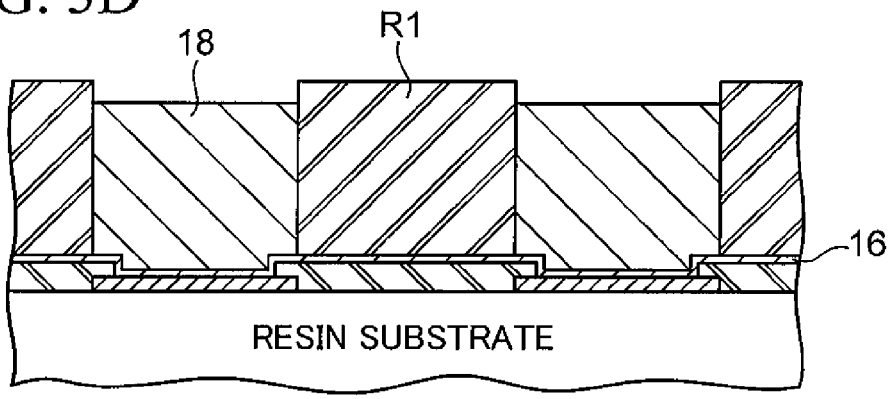

At the next step (see FIG. 6B), in the same manner as the process performed at the step shown in FIG. 3C, a plating resist is formed on the entire surface on the chip mounting surface side of the resin substrate 11 using a patterning material (a photosensitive dry film or a liquid photoresist), and an opening is formed in a desired position (i.e., a resist layer R2 having an opening OP2 is formed). The opening OP2 is formed by patterning in accordance with the outer shape of the cylindrically-shaped terminal 20a to be formed. In other words, the opening having a larger size than the pad portion 12P is formed in the pad portion 12P to which the cylindrically-shaped terminal 20a is to be connected. For example, when the size (diameter) of the pad portion 12P is about 60 μm, the opening OP2 having a size of about 120 μm is formed.

At the next step (see FIG. 6C), in the same manner as the process performed at the step shown in FIG. 3B, a seed layer 16a used as a power feed layer for electroplating in a later step is formed on the entire surface at the side on which the resist layer R2 is formed. For example, the formation of the seed layer 16a is accomplished by forming a conductor layer of titanium (Ti) with a thickness of about 0.1 μm by sputtering on the entire surface (on the pad portion 12P, the insulating layer 14 and the resist layer R2) on the chip mounting surface side, and further forming a conductor layer of copper (Cu) with a thickness of about 0.5 μm on the Ti layer by sputtering, thereby yielding the seed layer 16a having two-layer structure of Ti/Cu. The sputtering takes place at a low temperature (at 150° C. or less) so as to prevent a change in properties of the resist layer R2. Such a low-temperature treatment can be sufficiently achieved with low power. A portion of the seed layer 16a formed at this step forms the base portion 16a which constitutes a portion of the cylindrically-shaped terminal 20a as mentioned above.

At the next step (see FIG. 6D), a conductor layer 19a is formed on the seed layer 16a exposed from the opening OP2 (FIG. 6C) in the resist layer R2, by electroplating using the seed layer 16a as the power feed layer In this embodiment, the seed layer 16a is electroplated with copper (Cu) to form the conductor layer (Cu layer) 19a of about 5 μm thickness. The Cu electroplating takes place in a plating bath as heated to about 50° C. The Cu layer 19a is formed as the outer conductor layer of the bimetal (the cylindrically-shaped conductor portion 19) mentioned above.

At the next step (see FIG. 7A), a conductor layer 19b made of metal having a lower coefficient of thermal expansion than that of the metal (Cu) constituting the conductor layer 19a is formed on the conductor layer (Cu layer) 19a formed at the previous step, by electroplating using the conductor layer 19a as the power feed layer. In this embodiment, the conductor layer (Cu layer) 19a is electroplated with nickel (Ni) to form the conductor layer (Ni layer) 19b of about 5 μm thickness. The Ni electroplating takes place in a plating bath as heated to about 50° C., as in the case of the above-mentioned Cu electroplating. The Ni layer 19b is formed as the inner conductor layer of the bimetal (the cylindrically-shaped conductor portion 19) mentioned above. Incidentally, the coefficient of thermal expansion of Cu is about 17 ppm/° C., while the coefficient of thermal expansion of Ni is about 12 ppm/° C.

Figure 7A:
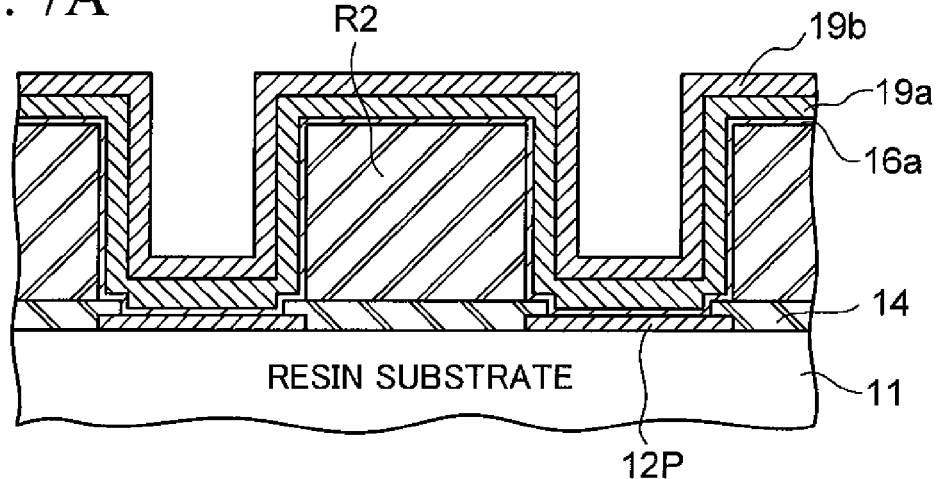
FIGS. 7A to 7C are sectional views showing steps following the steps shown in FIGS. 6A to 6D.
Figure 7B:
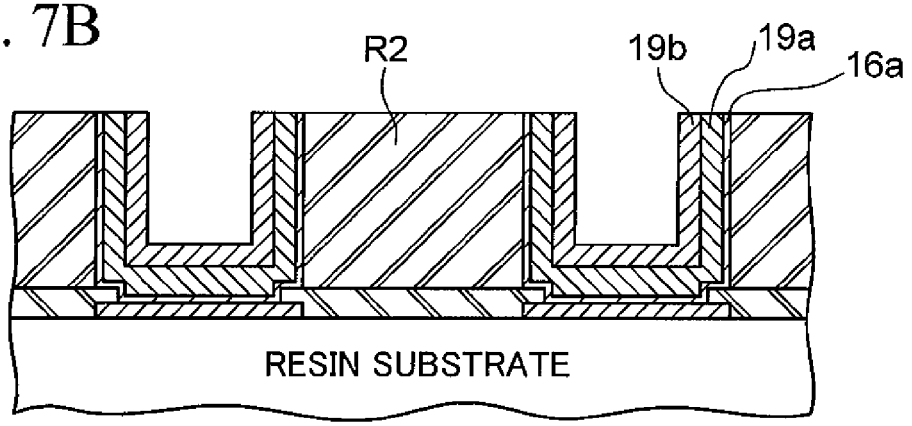
Figure 7C:
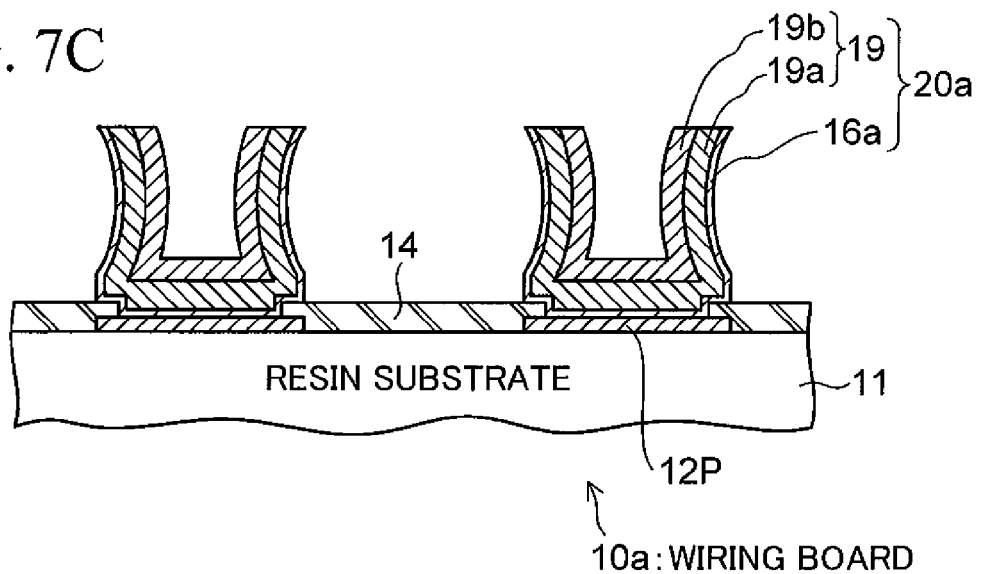

At the next step (see FIG. 7B), the seed layer 16a and the conductor layers 19a and 19b formed on the surface of the resist layer R2 are removed only on the portion above the top surface of the resist layer R2 (see FIG. 7A). For example, polishing takes place using chemical mechanical polishing (CMP), until an upper end surface of the resist layer R2 is exposed as shown in FIG. 7B.

At the final step (see FIG. 7C), the plating resist (the resist layer R2 shown in FIG. 7B) is removed. For example, where the dry film is used as the plating resist, an alkaline chemical liquid such as sodium hydroxide or a monoethanolamine-base liquid can be used for removal. Also, where the liquid resist such as the novolak-base resin or the epoxy-base resin is used as the plating resist, acetone, alcohol or the like can be used for removal. The removal of the plating resist takes place at room temperature (around 23° C.).

Thereby, the cylindrically-shaped conductor portion 19 (the Cu layer 19a and the Ni layer 19b) and the base portion 16a coating the outer periphery of the cylindrically-shaped conductor portion 19 exhibits an inwardly curved form in the middle portion as shown in FIG. 7C by the bimetal function of the cylindrically-shaped conductor portion 19. Namely, the removal of the resist layer R2 leads to the removal of the member supporting the cylindrically-shaped conductor portion 19 and the base portion 16a, and also, the Cu layer 19a and the Ni layer 19b under heat treatment around 50° C. are shrunk at room temperature (around 23° C.). On the occasion of shrinkage, the cylindrically-shaped conductor portion 19 is inwardly curved as shown in FIG. 7C, since the coefficient of thermal expansion of the outer metal (Cu) of the bimetal is higher than that of the inner metal (Ni).

The above steps result in the manufacture of the wiring board 10a according to the second embodiment.

The wiring board 10a is typically shipped as it is without a chip (an electronic component) being mounted thereon, however, the chip 30 may be mounted on the wiring board 10a to be shipped as the electronic component device 40, as shown in FIG. 8B, depending on customer demands. Description is given below with reference to FIGS. 8A and 8B with regard to a mounting method as employed in this instance.

First (see FIG. 8A), the wiring board 10a manufactured by the above-mentioned processes shown in FIGS. 6A to 7C is moved from an environment at room temperature (around 23° C.) to an environment heated to a temperature of about 200° C. Thereby, the outer Cu layer 19a having a higher coefficient of thermal expansion, of the conductor layers which constitute the cylindrically-shaped conductor portion (the bimetal) 19, expands more easily than the inner Ni layer 19b, so that the cylindrically-shaped conductor portion 19 exhibits a vertically straight form and is not constricted in the middle portion, as shown in FIG. 8A.

At this point, the electrode terminal 31 of the chip 30 can be inserted inside the cylindrically-shaped conductor portion 19, as shown in FIG. 8A. In the illustrated example, there is a gap between the tip end of the electrode terminal 31 of the chip 30 and the inner conductor layer 19b of the cylindrically-shaped conductor portion 19. However, of course, it will be understood that the tip end of the electrode terminal 31 may be brought into contact with the conductor layer 19b. Note that, in FIG. 8A, reference numeral 32 denotes a passivation film to function as a protection film for the chip 30; and 33 denotes a pad portion (e.g., a conductor layer of aluminum (Al)) exposed from the passivation film 32, and the electrode terminal 31 (e.g., a Cu bump, an Au bump, or the like) is bonded to the pad portion 33.

Next (see FIG. 8B), while this state (the state where the electrode terminal 31 of the chip 30 is inserted inside the cylindrically-shaped conductor portion 19) is maintained, the temperature is returned from the high-temperature state (about 200° C.) to the original room-temperature state. Thereby, as opposed to the previous step, the outer Cu layer 19a having the higher coefficient of thermal expansion shrinks more easily than the inner Ni layer 19b, so that the cylindrically-shaped conductor portion 19 exhibits a curved form in such a manner that it is constricted in the middle portion thereof, as shown in FIG. 8B. As a result, the outer periphery of the electrode terminal 31 of the chip 30 is brought into close contact with the inner periphery (the conductor layer 19b) of the middle portion of the cylindrically-shaped conductor portion 19, thus maintaining the electrical connection therebetween.

As described above, according to the wiring board 10a (an electronic component device 40a) and the method of manufacturing the same according to the second embodiment, the merits below are obtained, in addition to the effects obtained by the above-mentioned first embodiment (maintaining the electrical connection between the wiring board and the chip, substantially eliminating the warp in the wiring board after the mounting, and contributing to a reduction in cost, even if there is some misalignment between the relative positions of the wiring board and the chip due to the thermal stress which can be generated after the chip mounting).

Namely, the above-mentioned first embodiment requires the following processes: providing the resist layer R1 formed by patterning in accordance with the outer shape of the cylindrically-shaped terminal (the external connection terminal) 20 to be formed; providing the sacrificial layer 18 in the opening OP1 in the resist layer R1; then removing the resist layer R1; further laminating the protective tape PT to the sacrificial layer 18; etching the sacrificial layer 18 in the desired shape; then forming the cylindrically-shaped terminal 20, using the sacrificial layer 18; and finally removing the sacrificial layer 18. As opposed to this, in this embodiment, the formation of the cylindrically-shaped terminal 20a can be accomplished by performing plating with different metal seeds (Cu and Ni) sequentially in the opening OP2 in the resist layer R2 formed by patterning in accordance with the outer shape of the cylindrically-shaped terminal 20a to be formed, and finally by removing the resist layer R2. In other words, this embodiment can achieve simplification of the process, as compared to the above-mentioned first embodiment.

Meanwhile, as for the above-mentioned first embodiment (see FIGS. 5A to 5D), description is given taking the case where the conductor layer (the Cu post) 18 to define the outer shape of the cylindrically-shaped terminal 20 (the cylindrically-shaped conductor portion 17) is given Ni and Au electroless plating for the formation of the cylindrically-shaped conductor portion 17. However, of course, it will be understood that a combination of plating seeds for use is not limited to this. Desirably, metal which improves elasticity is selected as a plating seed, taking into account the function required for the cylindrically-shaped terminal 20 (the cylindrically-shaped conductor portion 17) (the function of undergoing elastic deformation while maintaining the contact with the electrode terminal 31, even if there is some misalignment between the relative positions of the cylindrically-shaped terminal 20 and the electrode terminal 31 of the chip 30 due to the thermal stress (the stress) being generated as shown in FIGS. 2B and 2C). For example, in the step shown in FIG. 5B, plating with an alloy of Ni and cobalt (Co), rather than the Ni plating, may be performed to form a plating film of NiCo. In this case, the plating requires only a change of a plating solution and thus does not cause an increase in the number of steps.

Also, as for the process according to the above-mentioned first embodiment, description is given taking the case where the final step (FIG. 5D) involves etching such that a portion of the sacrificial layer (the conductor layer) 18 remains (i.e., the portion is left as the reinforcing portion 18). However, it is not necessarily required that the reinforcing portion 18 be provided, as is also apparent from the gist of the present invention. In other words, the reason for this is that, even if the reinforcing portion 18 is not provided, the electrical connection is ensured between the cylindrically-shaped conductor portion 17 and the base portion 16 electrically connected to the pad portion 12P of the wiring board 10.

Therefore, the final step (FIG. 5D) may involve etching of the entire sacrificial layer 18. In this case, however, it is required that a different material from the material (Cu) constituting the sacrificial layer 18 be selected as the material of the seed layer 16 (at least the surface portion thereof), because the base portion (the seed layer) 16 to be finally exposed has to remain without being etched.

Also, as for the above-mentioned second embodiment, description is given taking the case where Cu and Ni are used as the metals constituting the principal portion of the cylindrically-shaped terminal 20a (the cylindrically-shaped conductor portion 19 of bimetal structure). However, of course, it will be understood that a combination of metals constituting the bimetal is not limited to this. The point is that the metallic materials are selected so that the relationship between the coefficients of thermal expansion of the metals constituting the bimetal represents that the coefficient of thermal expansion of the outer metal (the conductor layer 19a) is higher than that of the inner metal (the conductor layer 19b). For example, where Cu is used as the outer metal as shown in FIGS. 7A to 7C, chromium (Cr), an Ni—Cr alloy, an Ni—Co alloy, or the like may be appropriately used as the inner metal, in place of the above-mentioned Ni. The use of Ni—Co alloy, in particular, is advantageous in that the elasticity of the cylindrically-shaped conductor portion 19 can be improved, as in the case of the cylindrically-shaped conductor portion 17 according to the above-mentioned first embodiment.

Also, as for the above-mentioned embodiments, description is given taking the case where the resin substrate 11 (the wiring layers 12 and 13 are formed as the outermost layers, and the insulating layers 14 and 15 cover the wiring layers 12 and 13, respectively, exclusive of the pad portions 12P and 13P defined in the desired positions of the wiring layers 12 and 13) is used as the form of the wiring board in the stage before the formation of the cylindrically-shaped terminal 20 or 20a. However, of course, it will be understood that the form of the wiring board is not limited to the resin substrate, as is also apparent from the gist of the present invention. For example, the wiring board may be in the form of a silicon substrate for use in CSP (chip size packaging). In the case of this form, electrode pads of aluminum (Al), rather than the wiring layers 12 and 13 (pad portions 12P and 13P), are provided on the silicon (Si) substrate, and passivation films made of $SiO_2$, SiN, a polyimide resin or the like, rather than the insulating layers 14 and 15, are provided. Also, a ceramic substrate or the like may be used as another form.

What is claimed is:

1. A wiring board for use in mounting an electronic component, comprising:

an external connection terminal of a cylindrical shape, in which an electrode terminal of the electronic component is fitted, wherein the external connection terminal includes:

a first conductor portion formed on a pad portion formed on an electronic component mounting surface side of the wiring board;

a second conductor portion curvedly formed to be constricted in the middle portion thereof and electrically connected to a peripheral portion of the first conductor portion, the second conductor portion having a cylindrical shape such that an outer periphery of the electrode terminal comes into close contact with an inner periphery of the middle portion of the second conductor portion when the electrode terminal is inserted into the second conductor portion; and a third conductor portion provided to join together the first conductor portion and the second conductor portion in the vicinity of the bottom inside the second conductor portion.

2. The wiring board according to claim 1, wherein the second conductor portion is formed of a plating film containing metal that improves elasticity.

3. The wiring board according to claim 1, further comprising an insulating layer formed on the electronic component mounting surface side of the wiring board, wherein the pad portion is exposed from the insulating layer, and the first conductor portion is formed on the pad portion and on the insulating layer.

4. A wiring board for use in mounting an electronic component comprising:

an external connection terminal of a cylindrical shape, in which an electrode terminal of the electronic component is fitted, wherein the external connection terminal includes:

a first conductor portion curvedly formed to be constricted in the middle portion thereof in a cylindrical shape and including a portion electrically connected to a pad portion formed on an electronic component mounting surface side of the wiring board; and a second conductor portion curvedly formed to coat an overall inner surface of the first conductor portion and having a cylindrical shape such that an outer periphery of the electrode terminal comes into close contact with an inner periphery of the middle portion of the second conductor portion when the electrode terminal is inserted into the second conductor portion, wherein the second conductor portion has a structure in which two conductor layers having different coefficients of thermal expansion are laminated.

5. The wiring board according to claim 4, wherein the second conductor portion is formed of a plating film containing metal that improves elasticity.

6. The wiring board according to claim 4, wherein the two conductor layers consists of an outer conductor layer formed on the inner surface of the first conductor portion, and an inner conductor layer laminated on an inner surface of the outer conductor layer, the outer conductor layer being made of metal having a higher coefficient of thermal expansion than the inner conductor layer.

7. The wiring board according to claim 4, further comprising an insulating layer formed on the electronic component mounting surface side of the wiring board, wherein the pad portion is exposed from the insulating layer, and the first conductor portion is formed on the pad portion and on the insulating layer.

* * * * *